US006987435B2

(12) United States Patent
Ko et al.

(10) Patent No.: US 6,987,435 B2
(45) Date of Patent: Jan. 17, 2006

(54) MICRO-ELECTROMECHANICAL ACTUATORS

(75) Inventors: Jong Soo Ko, Daejeon-Shi (KR); Dae Sik Lee, Daejeon-Shi (KR); Myung Lae Lee, Busan-Shi (KR); Chi Hoon Jun, Daejeon-Shi (KR); Youn Tae Kim, Daejeon-Shi (KR)

(73) Assignee: Electronics and Telecommunications Research Institute, (KR)

( * ) Notice: Subject to any disclaimer, the term of this patent is extended or adjusted under 35 U.S.C. 154(b) by 0 days.

(21) Appl. No.: 10/185,654

(22) Filed: Jun. 27, 2002

(65) Prior Publication Data

US 2003/0132822 A1 Jul. 17, 2003

(30) Foreign Application Priority Data

Jan. 16, 2002 (KR) .................................. 2002-2495

(51) Int. Cl.
*H01H 51/22* (2006.01)
(52) U.S. Cl. ......................................... 335/78; 200/181
(58) Field of Classification Search ............ 335/78–86; 257/414–427; 200/181–182; 361/232–234
See application file for complete search history.

(56) References Cited

U.S. PATENT DOCUMENTS 5,322,258 A    6/1994   Bosch et al.
5,606,447 A * 2/1997 Asada et al. ................. 359/199
5,945,898 A    8/1999   Judy et al.
6,124,650 A    9/2000   Bishop et al.
6,133,670 A * 10/2000 Rodgers et al. ............. 310/309
6,593,870 B2 * 7/2003 Dummermuth et al. ..... 341/155
6,621,390 B2 * 9/2003 Song et al. .................... 335/78
6,664,786 B2 * 12/2003 Kretschmann et al. ...... 324/259

FOREIGN PATENT DOCUMENTS

JP     2001-0083923    9/2001

OTHER PUBLICATIONS

1998 Elsevier Science S.A., "Numerical simulation and optimization of planar electromagnetic actuators", A. Feustel, et al., 7 pages.

* cited by examiner

*Primary Examiner*—Lincoln Donovan
(74) *Attorney, Agent, or Firm*—Blakely, Sokoloff, Taylor & Zafman

(57) ABSTRACT

The present invention relates to a micro-electromechanical actuator. An electromagnetic-type micro-electromechanical actuator of the present invention has a conductive beam formed in a micro electronic substrate on an upper side of a magnetic substance, so that the conductive beam can be moved toward an in-plane mode in parallel to the micro electronic substrate depending on a direction that current flows. Therefore, the micro-electromechanical actuator can be applied to most of electromagnetic micro-electromechanical systems that require an in-plane mode.

15 Claims, 9 Drawing Sheets

FIB. 10C

MICRO-ELECTROMECHANICAL ACTUATORS

BACKGROUND OF THE INVENTION

1. Field of the Invention

The invention relates generally to an actuator to be used in a micro-electromechanical system, and more particularly to, an electromagnetic-type actuator for providing a parallel displacement to the surface of a microelectronic substrate.

2. Description of the Prior Art

An actuator which is the most important component in the micro-electromechanical system, has been implemented through a lot of driving principles. As one example, there are an electrostatic actuator using an electrostatic force between two different electrodes, a piezoelectric actuator using a piezoelectric material, a thermal actuator using thermal expansion of materials or thermal expansion of air contained within a limited space, an electromagnetic actuator using an electromagnetic force, and the like.

Many micro-electromechanical devices have been manufactured by means of above-mentioned driving principles. For example, there are a micro-gear, a micro-motor and a micro-machined device which can be moved or apply force, or the like. These micro-electromechanical devices can be applied to various applications. For example, they can be applied to an ultra fine fluid control device having a micropump, a valve or a mixer, an optical device having an optical switch, a shutter, or an attenuator, and an electrical device having a relay or an RF switch.

Of them, an electromagnetic-type actuator is driven using an electromagnetic force generated by means of coupling of a coil through which current flows and a magnetic substance. This electromagnetic-type actuator is advantageous in that it has relatively great displacement and force, and a rapid response speed. However, there are not so many cases that the electromagnetic actuator is applied to the micro-electromechanical system, compared to the micro actuator using other driving principle. The reason is that the electromagnetic-type actuator has many disadvantages such as complication of manufacturing process and difficulty of a fine displacement with its various advantages. In addition, the electromagnetic-type actuator has many complications in manufacturing process and requires a large number of masks, since a coil and a magnetic substance are used.

A typical example of a driving principle of the electromagnetic-type actuator includes U.S. Pat. No. 5,945,898 entitled 'Magnetic Micro-actuator' and issued Aug. 31, 1999, and U.S. Pat. No. 6,124,650 entitled 'Non-Volatile MEMS Micro-Relays Using Magnetic Actuators' and issued Sep. 26, 2000.

The U.S. Pat. No. 5,945,898 proposes a magnetic actuator in which a plate made of a magnetic substance stands up in a vertical direction by means of a magnetic field vertically generated in the electromagnetic plate. Further, the U.S. Pat. No. 6,124,650 proposes a structure in which a plurality of metal wires of a straight line is formed on a micro electronic substrate, a cantilever is formed at the side of the metal wire and the cantilever is floated on the metal wire. At this time, the magnetic substance is moved up and down depending on the direction of current flowing through the metal wire since the magnetic substance is formed on the cantilever. The micro cantilever is operated by the up and down movement of the cantilever.

Most actuators using the above electromagnetic force as the driving principle are manufactured as follows. A coil is first formed on an electromagnetic substrate. An empty space is then formed on the coil and a cantilever or a membrane is secondly formed. Next, a magnetic substance is formed on it. At this time, the two U.S. patents proposed above do not go beyond this range. This type of the electromagnetic-type micro-electromechanical actuator is basically limited to movement in a vertical direction to the electromagnetic plate.

SUMMARY OF THE INVENTION

The present invention is contrived to solve the above problems and an object of the present invention is therefore to provide an electromagnetic-type micro-electromechanical actuator in which a conductive beam formed on a micro electronic substrate is arranged over a magnetic substance, thus the conductive beam is movable at in-plane mode along the direction of current.

In order to accomplish the above object, a micro-electromechanical actuator according to the present invention comprises a micro electronic substrate having a surface, a magnetic substance formed at one side of the micro-electronic substrate; and a plurality of conductive beams formed on one or both sides of the micro-electronic substrate, wherein the conductive beams are moved along a given path in parallel extended against an upper surface of the microelectronic substrate by means of Lorentz force due to an electromagnetic force of the magnetic substance.

BRIEF DESCRIPTION OF THE DRAWINGS

The aforementioned aspects and other features of the present invention will be explained in the following description, taken in conjunction with the accompanying drawings, wherein:

FIG. 10(a)~FIG. 10(c) are cross-sectional views of devices for describing a method of manufacturing a conductive beam of an actuator and a silicon spacer using are an electroplating method.

DETAILED DESCRIPTION OF PREFERRED EMBODIMENTS

Figure 1:
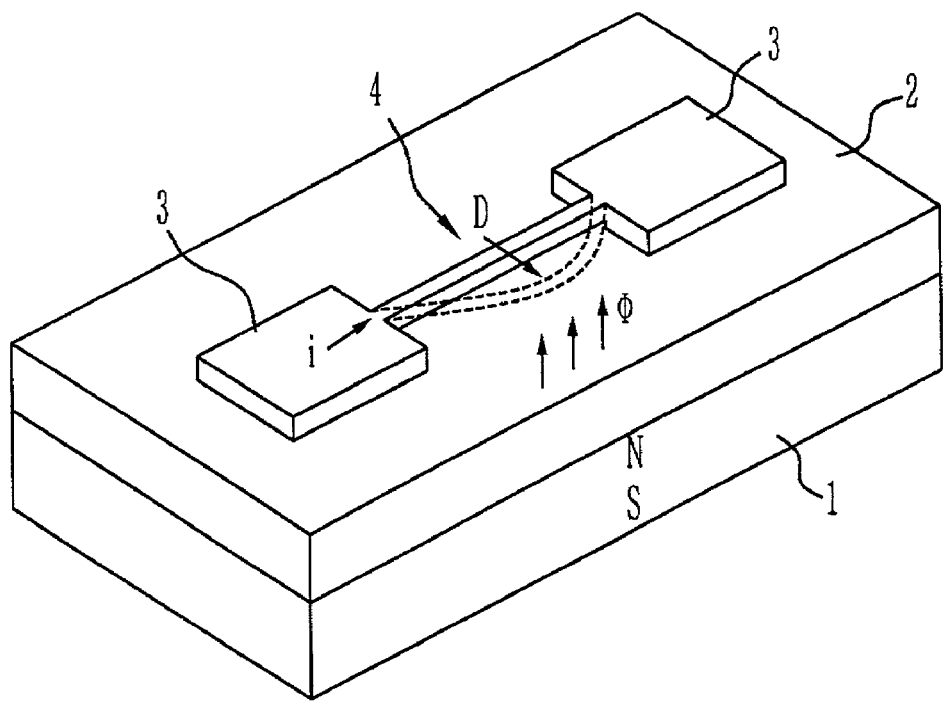
FIG. 1 shows an electromagnetic-type micro-electromechanical actuator according to a preferred embodiment of the present invention.

The present invention will be described in detail by way of a preferred embodiment with reference to accompanying drawings, in which like reference numerals are used to identify the same or similar parts.

FIG. 1 shows an electromagnetic-type micro-electromechanical actuator according to a preferred embodiment of the present invention.

Referring now to FIG. 1, the electromagnetic-type micro-electromechanical actuator includes a magnetic substance 1, a micro electronic substrate 2 formed on the substrate 1, and electrodes 3 formed on both sides of the micro electronic substrate 2. Further, a conductive beam 4 is formed so that the electrodes 3 on both sides can be supported.

At this case, the magnetic substance 1 may be formed of a magnet such as paramagnetic substance or may be formed by coils wound on the micro electronic substrate 2. The micro electronic substrate 2 may be formed of one of silicon, glass, PCB (printed circuit board), acryl, polymer, metal and a magnetic substance. The conductive beam 4 may be formed of a single conductive material such as single metal, single crystal silicon or polysilicon, heterogeneous metal material or composite materials such as silicon and metal, glass and metal or polymer and metal.

If current is applied to the conductive beam 4 and magnetic flux($\Phi$) is applied as shown in arrow of FIG. 1, the conductive beam 4 is bent in a direction of dotted lines parallel to the micro electronic substrate 2. The displacement (D) is also represents in FIG. 1. This movement direction of the conductive beam 4 is determined by Fleming's left-hand rule. An electromagnetic force for bending the conductive beam 4 is called Lorentz's force. At this case, if current flows in an opposite direction, the conductive beam 4 is bent in an opposite direction.

Figure 2A:
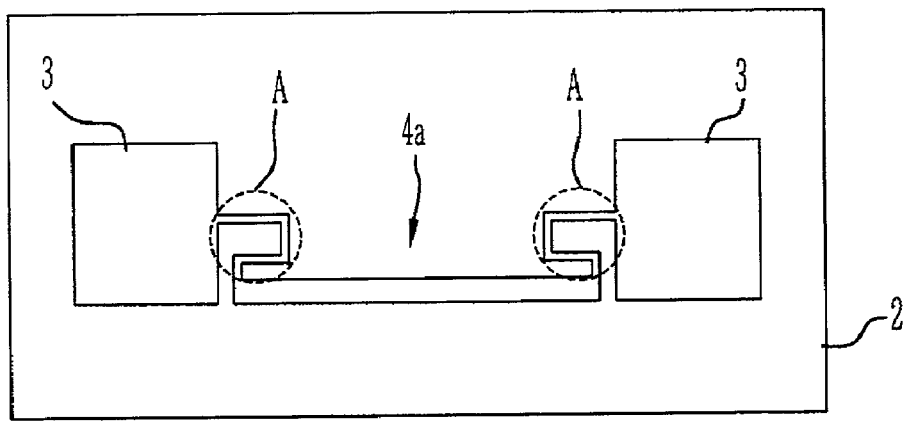
FIG. 2(a)~FIG. 2(c) illustrate another embodiments of actuators for expanding displacement of a conductive beam in an actuator shown in FIG. 1.
Figure 2B:
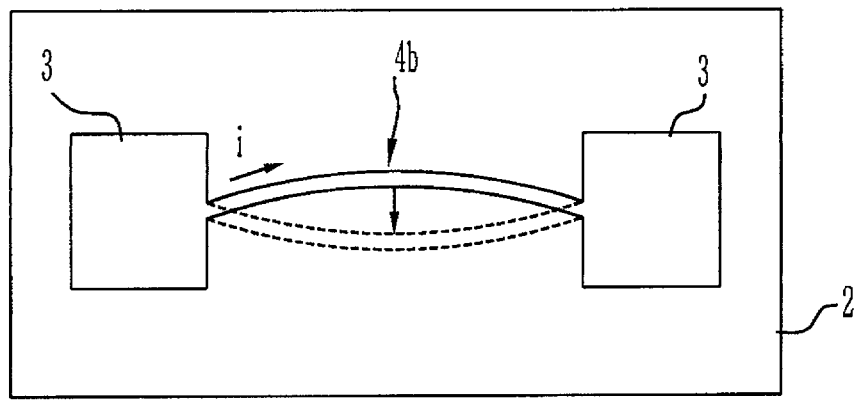
Figure 2C:
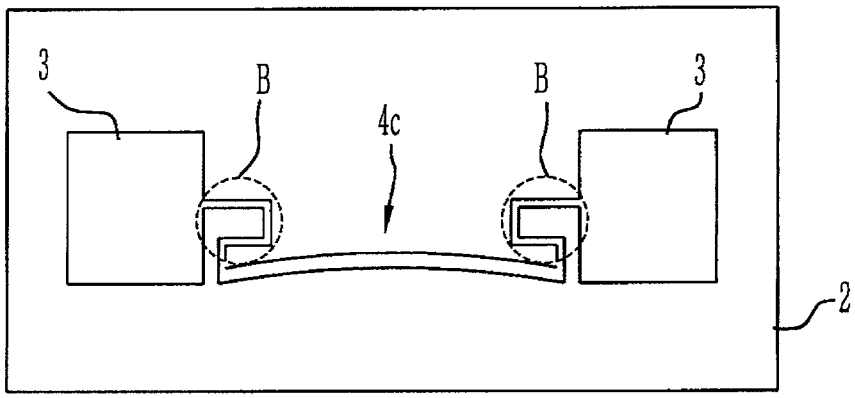

In order to smooth the movement of the conductive beam 4 having this characteristic and expand displacement of the conductive beam 4, structures shown in FIG. 2(a)~FIG. 2(c) are proposed.

Referring to FIG. 2(a), a conductive beam 4a having a connection portion of a 'S' shape such as a portion 'A' shown at both ends connected to the electrode 3 connected to an upper surface of the micro electronic substrate 2. It should be noted that the conductive beam 4a may be implemented to have connections portions of various shapes such as a 'T' shape as well as the 'S' shape. Also, the connection portion may be also located at the center of the conductive beam 4a as well as both ends of the conductive beam 4a.

FIG. 2(b) shows that a circular conductive beam 4b makes the conductive beam 4, shown in FIG. 1, move exactly by a given distance or makes a longer displacement of the conductive beam 4. It should be noted that the conductive beam 4b might have various shape such as a consecutive 'S' shape or a zigzag shape as well as a circular shape.

By reference to FIG. 2(c), there is shown a new type conductive beam 4c in which the conductive beams 4a and 4b shown in FIGS. 2(a) and 2(b) are coupled. In other words, the conductive beams 4c has the circular shape shown in FIG. 2(b) but has a connection part having a 'S' shape at both ends connected to the electrodes 3 as in 'B'.

Figure 3A:
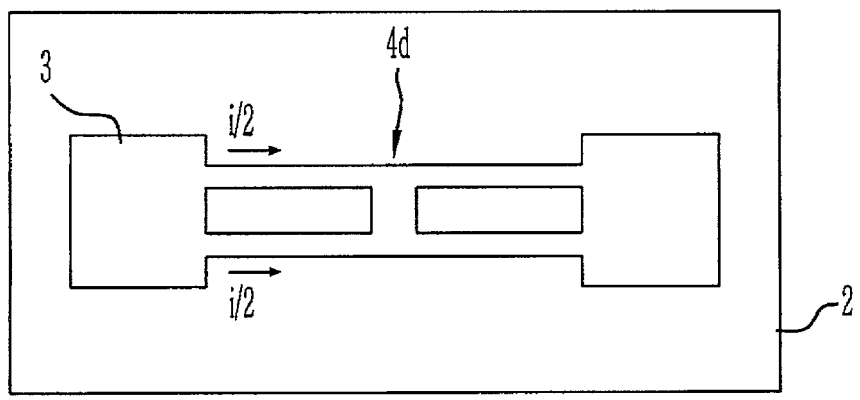
FIG. 3(a)~FIG. 3(c) show actuators having a multi beam as an another embodiment of the actuator shown in FIG. 1.
Figure 3B:
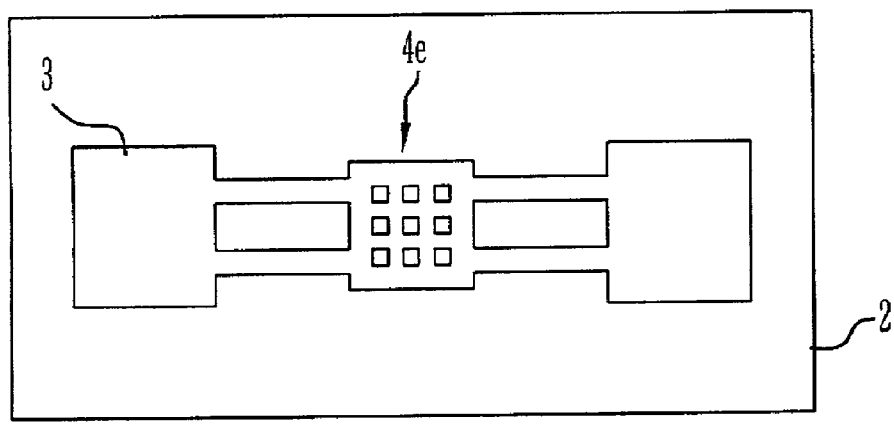
Figure 3C:
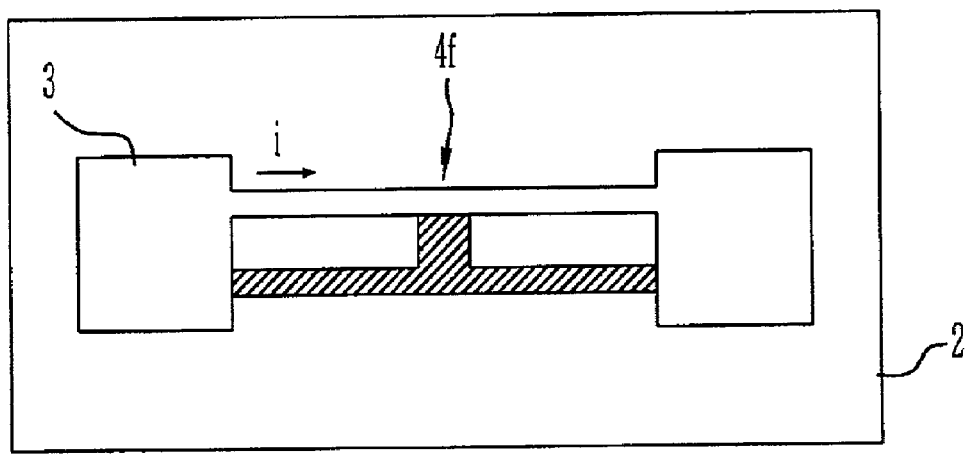

As mentioned above, the conductive beam may be implemented as a single beam shape but may be implemented as a multi beam shape as FIG. 3(a)~FIG. 3(c) depending on its application purpose of the conductive beam.

In FIG. 3(a), a multi-conductive beam 4d is shown, which can safely move, in an in-plane mode without bending when the conductive beam 4 shown in FIG. 1 moves in an in-plane mode on the micro electronic substrate 2.

FIG. 3(b) shows that a multi-conductive beam 4e having a driving plate which moves in parallel to the micro electronic substrate 2 at the central portion of the multi-conductive beam 4d shown in FIG. 3(a).

The driving plate may be manufactured to have different shapes depending on the purpose of use. In particular, the driving plate may be formed to have a vertical shape or a block shape.

By reference to FIG. 3(c), there is shown a multi composite beam 4f comprises more than one conductive beam of the multi conductive beams 4d shown in FIG. 3(a) and remaining beams are non-conductive beam. The central portions on both ends of the conductive and non-conductive multi-composite beams may be connected to the driving plate such as the multi-conductive beam 4e shown in FIG. 3(b).

Figure 4:
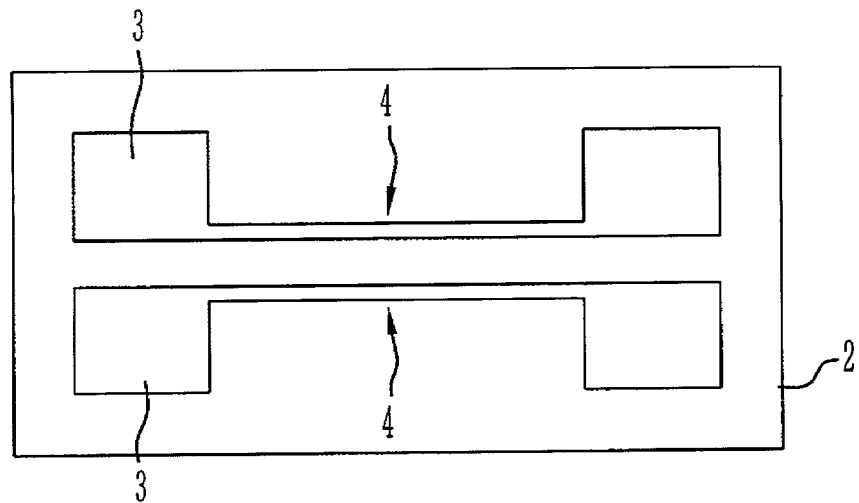
FIG. 4 shows an actuator in which a plurality of conductive beams are formed as another embodiment of the actuator shown in FIG. 1.
Figure 5:
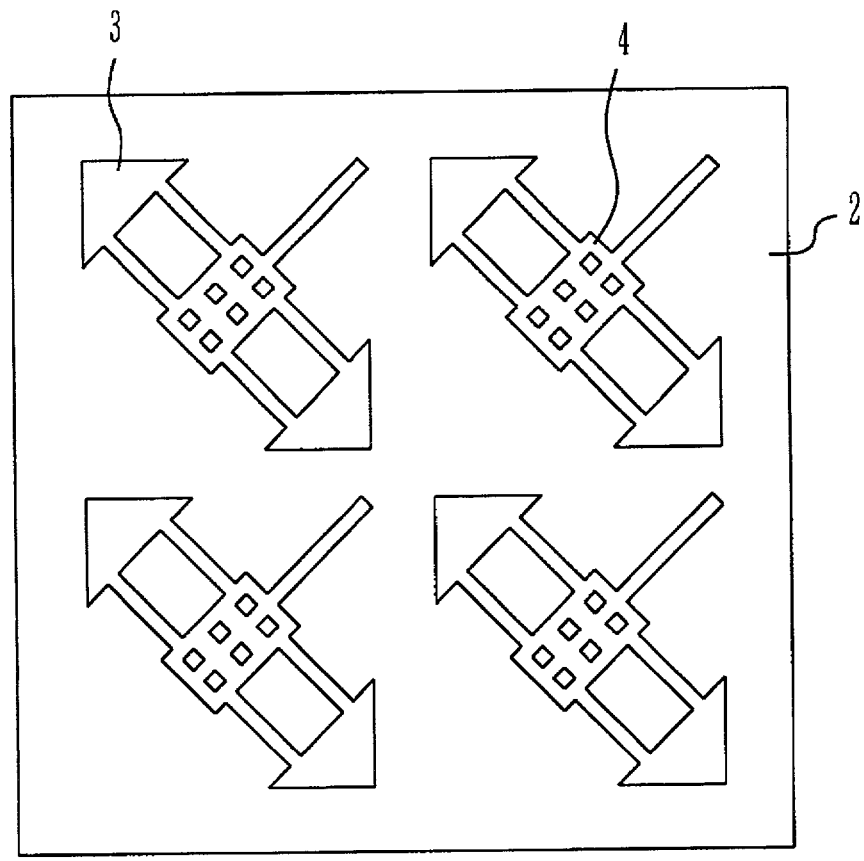
FIG. 5 shows an actuator in which a plurality of conductive beams are arranged as another embodiment of the actuator shown in FIG. 4.

In addition, as shown in FIG. 4, the electromagnetic-type micro-electromechanical actuator shown in FIG. 1 according to the present invention may have two or more individual actuators on the micro electronic substrate 2. The plurality of the electromagnetic-type micro-electromechanical actuators may be arranged on the micro electronic substrate 2, as shown in FIG. 5.

Figure 6A:
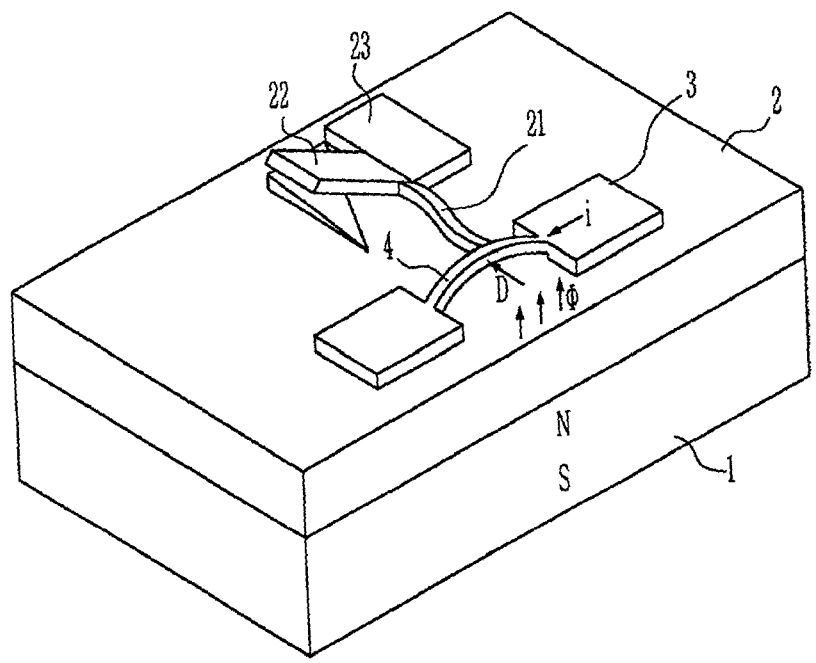
FIG. 6a~FIG. 6c illustrate actuators for transforming a horizontal movement of the conductive beam in the actuator shown in FIG. 1 into a vertical movement or a rotating movement and increasing the dispacement of the conductive beam.
Figure 6B:
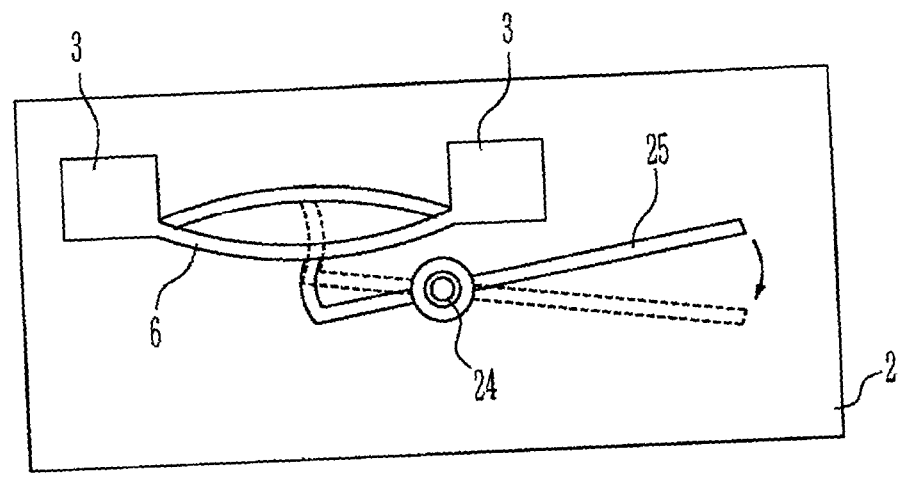
Figure 6C:
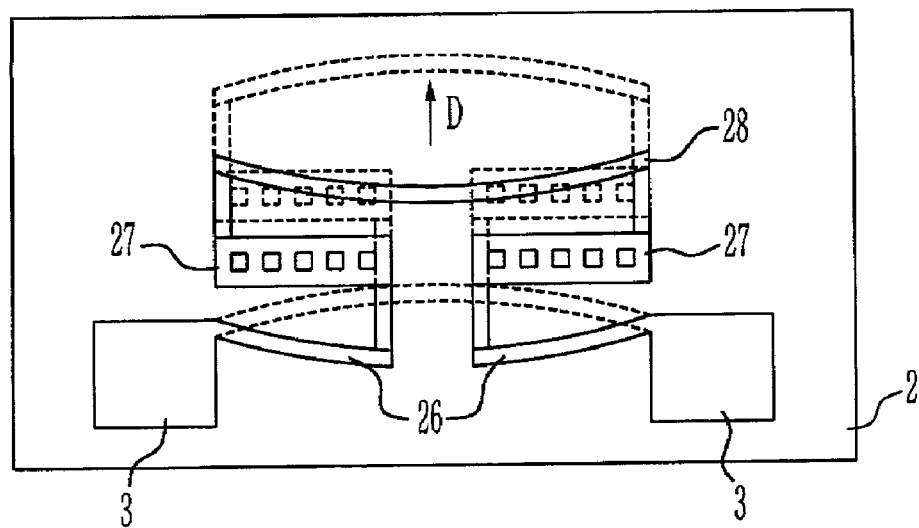

Meanwhile, a method of transforming a horizontal movement of the conductive beam in the electromagnetic-type micro-electromechanical actuator to a vertical movement or a rotating movement is shown in FIG. 6a~FIG. 6c.

Referring now to FIG. 6a, there is shown a new structure in which a distortion bar 21 and a driving plate 22 are connected at both ends or central portion of the conductive beam 4, and an additional structure such as a guide 23 is formed on a first surface of the micro electronic substrate 2, in order to transform the horizontal movement of the conductive beam 4 shown in FIG. 1 into a horizontal movement and increase the displacement of the conductive beam 4.

Further, in order to change the horizontal movement of the conductive beam 4 to a rotating movement, a gear (not shown) or a toothed wheel (not shown) may be connected to both ends or central portion of the conductive beam 4.

FIG. 6b shows a structure in which a bar 25 is installed at the central portion of the circular conductive beam 4b shown in FIG. 2(b). The bar 25 moves in the type of seesawing at the center of around the hinge 24 for the purpose of amplifying displacement of the circular conductive beam 4b or transforming the straight-line movement of the circular beam 4b to the rotating movement.

FIG. 6c shows a structure for expanding the linear displacement of the first transformation beam 26 and the second transformation beam 28 of a circular shape shown in FIG. 6b. The first transformation beam 26 and the second transformation beam 28 are connected with folded type.

Figure 7:
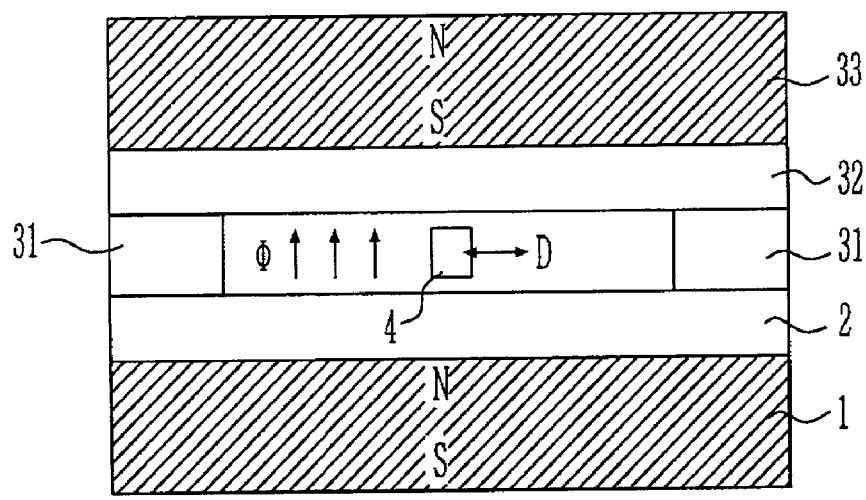
FIG. 7 illustrate an actuator for increasing the magnetic flux uniformity and the magnetic flux as another embodiment of the actuator shown in FIG. 1.

Further, as shown in FIG. 7, there is shown a new structure in which a micro electronic substrate 32 and a magnetic substance 33 are formed on the micro-electromechanical actuator shown in FIG. 1 and a silicon spacer is connected between micro electronic substrates 2 and 32, in order to form an uniform magnetic flux and to increase the magnetic density toward a vertical direction from the micro electronic substrate.

Figure 8A:
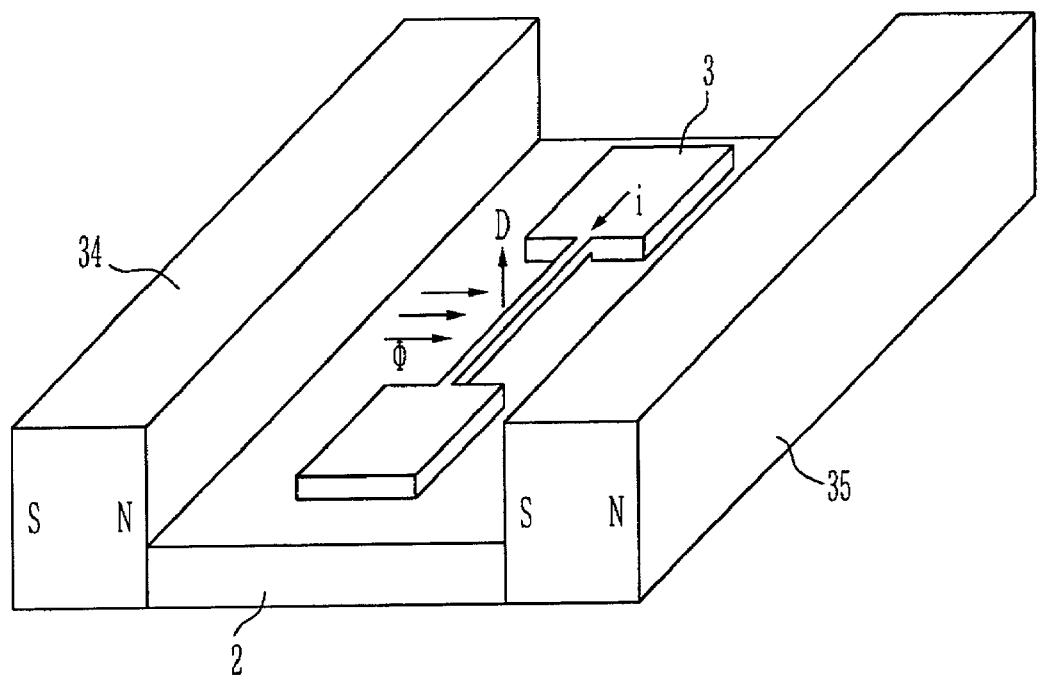
FIG. 8a and FIG. 8b illustrate actuators as another embodiment of the actuator shown in FIG. 1.
Figure 8B:
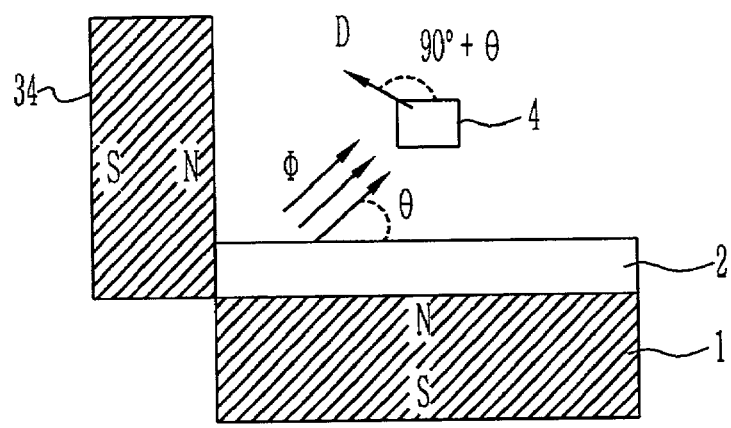

Also, a new method is proposed by which the location of the magnetic substance for generating a magnetic flux is differently positioned to change the direction of a magnetic flux to a desired direction, as shown in FIG. 8a and FIG. 8b.

Referring to FIG. 8a, it is shown a structure in which magnetic substances 34 and 35 are formed at the right and left side of the micro electronic substrate 2. Thereby, the magnetic flux vertically applied to the micro-electronic substrate 2 shown in FIG. 1 is changed to a direction horizontal to the micro electronic substrate 2, so that the conductive beam 4 is moved to a direction vertical to the micro electronic substrate 2.

Referring now to FIG. 8b, there is shown a new structure in which the magnetic substance 1 and 34 are formed at bottom and at the left side of the micro-electronic substrate. Thereby, the magnetic substances 1 and 34 allow the direction of the magnetic flux to slant by 'θ' against the micro-electronic substrate 2 and the conductive beam 4 is thus moved by an angle of '90°+θ' against the micro-electronic substrate 2. Also, in order to control the intensity and direction of the magnetic flux, at least one magnetic substances may be formed on, below and right, left sides of the micro electronic substrate 2.

A method of manufacturing the conductive beam and the silicon spacer proposed by the present embodiment will be described by reference to FIG. 9(a)~FIG. 9(c) and FIG. 10(a)~FIG. 10(c). At this case, FIG. 9(a)~FIG. 9(c) illustrate a method of manufacturing the conductive beam and the silicon spacer using a SOI (silicon on insulator) and FIG. 10(a)~FIG. 10(c) illustrate a method of manufacturing the conductive beam and the silicon spacer using an electroplating method.

Figure 9A:
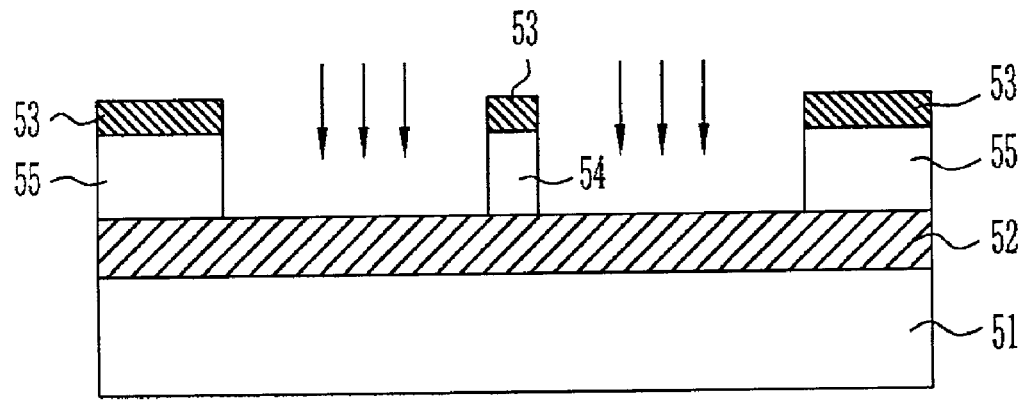
FIG. 9(a)~FIG. 9(c) are cross-sectional views of devices for describing a method of manufacturing a conductive beam of an actuator and a silicon spacer using a SOI wafer.
Figure 10A:
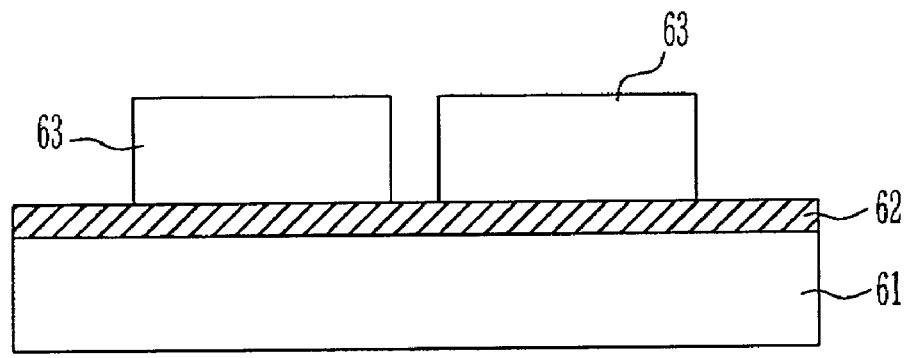
Figure 10B:
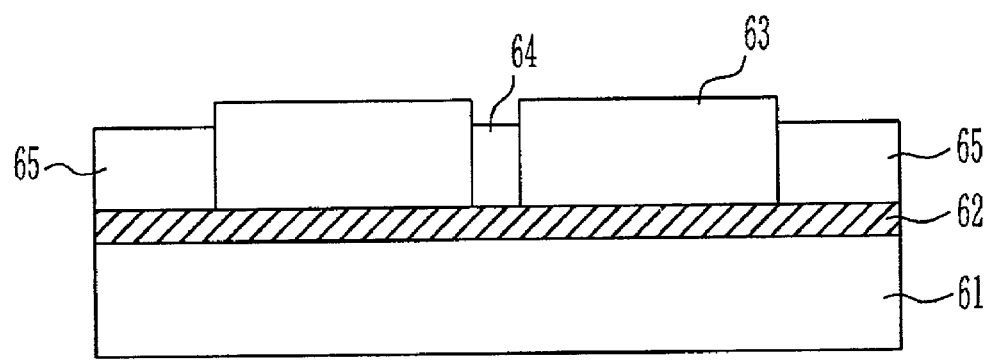
Figure 10B:
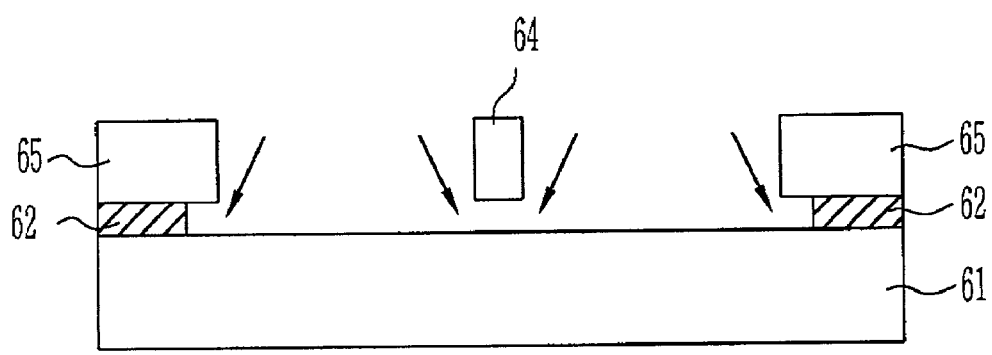

Referring to FIG. 9(a), a silicon oxide layer 52 and an upper silicon substrate (not shown) are sequentially deposited on a lower silicon substrate 51. A photolithography process is then performed to form a photoresist film 53 so that a given portion of the upper silicon substrate can be exposed. Next, the exposed upper silicon substrate is etched by a silicon dry etch process using the photoresist film 53 as a mask, thus forming the silicon beam 54 and a silicon spacer 55.

Figure 9B:
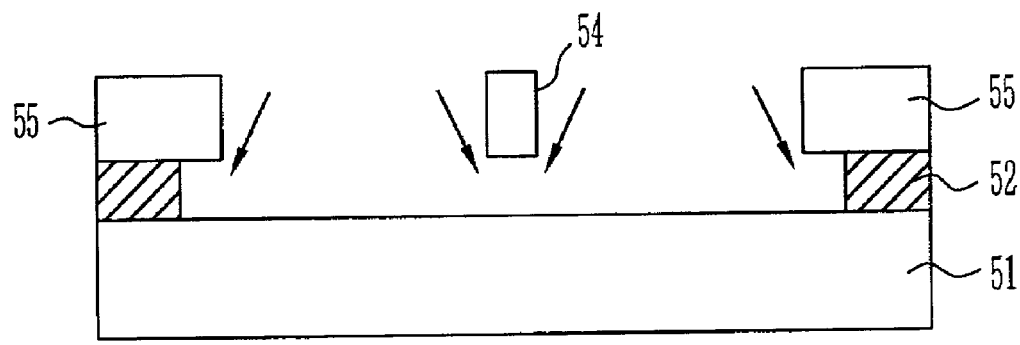

By reference to FIG. 9(b), a silicon oxidization wet etch process is performed so that the silicon oxide layer 52 remains only under the silicon spacer 55. Thereby, the silicon beam 54 is floated on the lower silicon substrate 51.

Figure 9C:
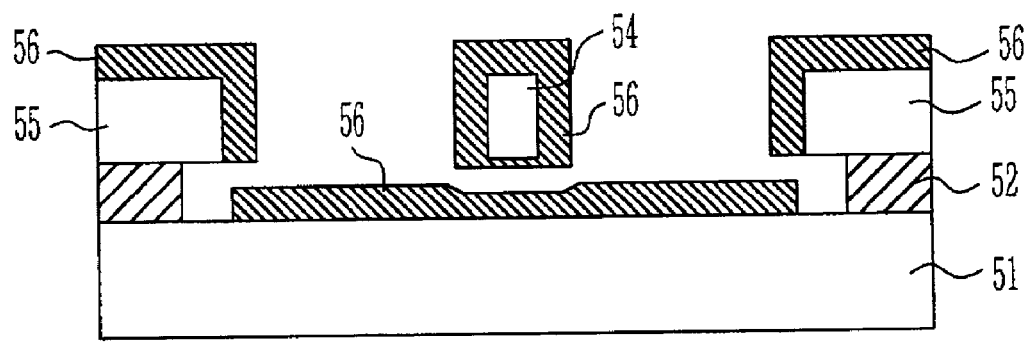

Referring now to FIG. 9(c), a metal deposition process is performed on the entire structure to deposit a metal layer 56 on the lower silicon substrate 51 exposed between the silicon spacer 55, the silicon beam 54 and the silicon spacer 55. Thereby, not only the conductivity of the silicon beam 54 can be increased but also can the electrode can be formed using the metal layer 56 deposited on the silicon spacer 55.

As above, if the metal layer 56 surrounds the external portion of the silicon beam 54, problems that may occur in the beam made of silicon or the beam made of a metal can be solved. In other words, most of current flowing into the beam made of silicon are dissipated as heat since the beam made of silicon has a higher resistance than the beam made of a metal even when the surface of silicon is doped with a high concentration,. On the contrary, in case of the beam made of a metal, there is a problem that a fatigue breakage may occur since the current of the beam made of the metal is better than that of the beam made of silicon but the mechanical strength of the beam made of the meal is lower than that of the beam made of silicon.

At this time, FIG. 9(a)~FIG. 9(c) are examples manufactured using the SOI wafer. A material of the silicon beam and the silicon spacer may be other materials such as polysilicon, glass, polymer, or the like as well as single crystal. In order to increase the conductivity of these materials, a metal is deposited as in FIG. 9(c).

Meanwhile, referring now to FIG. 10(a), a metal sacrificial layer 62 such as aluminum or chrome is deposited on a glass substrate 61. A photolithography process is then performed to form a photoresist film 63 of a high cross-sectional ratio, so that a given portion of the metal sacrificial layer 62 is exposed.

Referring now to FIG. 10(b), an electroplating method that a positive electrode is connected to the metal sacrificial layer 62 and a negative electrode is dipped into a plating solution such as copper or nickel is performed. At this case, the electroplated beam 64 and the electroplated spacer 65 are simultaneously formed.

By reference to FIG. 10(c), a photoresist film strip process of photo-resist is performed to remove the photoresist film 63 of a high cross-sectional ratio. The metal sacrificial layer 62 is then etched to float the electroplated beam 64 on the glass substrate 61. At this case, it should be noted that the type of material used in the metal sacrificial layer 62 and the type of a metal used in the electroplating layer are not limited to the illustrate metals but the metal sacrificial layer and the electroplating layer may be instead formed using the heterogeneous metals or a combination of them.

As mentioned above, the present invention proposes an electromagnetic-type micro-electromechanical actuator in which a conductive beam formed in a micro electronic substrate is positioned on an upper side of the magnetic substance, so that the conductive beam is movable in an in-plane mode to the micro electronic substrate. Therefore, there is an advantage in the present invention that it can be applied to most of electromagnetic micro-electromechanical system requiring an in-plane mode.

Further, the present invention has advantages that a process of manufacturing the electromagnetic micro-electromechanical actuator is simple and IC integration with a circuit is simple, compared to a process of manufacturing an electromagnetic micro-actuator.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A micro-electromechanical actuator, comprising:
   a micro electronic substrate having an upper and a lower surface;
   a permanent magnetic substance formed on the lower surface of said micro electronic substrate to generate a magnetic field perpendicular to the upper surface of the micro electronic substrate; and
   at least one conductive beam formed on the upper surface of said micro-electronic substrate, each conductive beam including end portions and a connection portion, said at least one conductive beam being fixed at said end portions and being movable at said connection portion, the end portions being connected to electrodes;
   wherein the connection portion of the at least one conductive beams is movable perpendicular to the conductive beam, in a plane parallel to the upper surface of said micro electronic substrate by means of Lorentz force due to an electromagnetic force of said magnetic substance by applying current to the conductive beam through the electrodes.

2. The micro-electromechanical actuator as claimed in claim 1, wherein said conductive beam has beams of a 'T' shape or a 'S' shape at its both ends or at its central portion.

3. The micro-electromechanical actuator as claimed in claim 1, wherein said conductive beam has a curved shape, a 'S' shape, a 'V' shape, a zigzag shape, a coupled shape of these shapes.

4. The micro-electromechanical actuator as claimed in claim 1, wherein both ends or a central portion of said conductive beam are/is connected to a plate made in a parallel direction to the conductive beam or a structure of a block shape made in a vertical direction to the conductive beam.

5. The micro-electromechanical actuator as claimed in claim 1, wherein said conductive beam is a multi-beam made of more than one beam the central portions of which are connected each other.

6. The micro-electromechanical actuator as claimed in claim 5, wherein the portion of said multi-beam to which the plurality of beams are connected has a flat or block shape.

7. The micro-electromechanical actuator as claimed in claim 5, wherein said at least one conductive beam is made of a conductor.

8. The micro-electromechanical actuator as claimed in claim 5, wherein said more than one of the plurality of beams are conductors and the remaining beams are non-conductors.

9. The micro-electromechanical actuator as claimed in claim 1, wherein both ends or the central portion of said conductive beam are connected to a bar of a seesaw shape so that displacement can be expanded.

10. The micro-electromechanical actuator as claimed in claimed in claim 5, wherein said conductive beam is made of single conductive materials such as single metal, single crystal silicon or polycrystalline silicon, or a heterogeneous metal.

11. The micro-electromechanical actuator as claimed in claim 1, wherein said conductive beam is made of composite materials such as silicon and a metal, silicon oxide and a metal, silicon nitride and a metal, glass and a metal, or polymer and a metal.

12. The micro-electromechanical as claimed in claim 1, wherein said surface of micro-electronic substrate further comprises a guide structure or a micro rack and pinion for transforming the horizontal movement of the conductive beam to the vertical movement is formed at one side of the micro electronic substrate.

13. The micro-electromechanical actuator as claimed in claim 1, wherein said micro electronic substrate is made of one of silicon, glass, PCB, acryl, polymer, metal and a magnetic substance.

14. The micro-electromechanical actuator as claimed in claim 1, wherein both sides or the central portion of said conductive beam are or is connected to a distortion bar or a gear so that the horizontal movement of the conductive beam is changed to the vertical movement.

15. The micro-electromechanical actuator as claimed in claim 1, wherein said at least one conductive beam is made of a conductor.

* * * * *